United States Patent [19]

Jackson et al.

[11] Patent Number: 4,654,475
[45] Date of Patent: Mar. 31, 1987

[54] ELASTOMERIC ELECTRO-CONDUCTIVE DEVICES

[75] Inventors: John Jackson; Seyed A. Angadjivand, both of Glasgow, Scotland

[73] Assignee: University of Strathclyde, Glasgow, United Kingdom

[21] Appl. No.: 821,443

[22] Filed: Jan. 22, 1986

[30] Foreign Application Priority Data

Jan. 29, 1985 [GB] United Kingdom ............... 8502203

[51] Int. Cl.⁴ .................... H01B 15/08; H01B 1/24
[52] U.S. Cl. .................... 174/94 R; 128/639; 252/511; 338/210
[58] Field of Search ............ 174/94 R; 338/210, 211, 338/212; 219/541, 548, 549; 252/511; 128/639, 640, 641, 642, 643, 644, 798, 802, 803

[56] References Cited

U.S. PATENT DOCUMENTS

| | | | |
|---|---|---|---|
| 2,734,978 | 2/1956 | Bulgin | 338/2 X |
| 3,124,769 | 3/1964 | Peterson | 338/2 |
| 3,387,248 | 6/1968 | Rees | 338/211 |
| 3,572,322 | 3/1971 | Wade | 128/670 X |
| 3,719,913 | 3/1973 | DuBose et al. | 338/2 |
| 3,820,529 | 6/1974 | Gause et al. | 338/5 X |
| 4,020,014 | 4/1977 | Service et al. | 252/511 |
| 4,051,454 | 9/1977 | Leiser et al. | 338/210 X |
| 4,273,697 | 6/1981 | Sumimura et al. | 252/511 X |

FOREIGN PATENT DOCUMENTS

41807 6/1981 European Pat. Off. .
89843 3/1983 European Pat. Off. .

*Primary Examiner*—Arthur T. Grimley
*Assistant Examiner*—Morris H. Nimmo
*Attorney, Agent, or Firm*—Bell, Seltzer, Park & Gibson

[57] ABSTRACT

An elastomeric electro-conductive device 10 for human/animal joint movement monitoring comprises a silicone polymer non-conductive substrate 11 carrying an elastomeric electro-conductive member 12 formed from silicone polymer loaded with graphite carbon particles. Conductor means 14A,14B enable connection of the device 10 to an electrical network and comprise lengths 15 of conductive silicone rubber adhesively secured at one end to member 12 by a body 18 of elastomeric bonding material. The body 18 and the member 12 have the same electrical characteristics and may have identical constituents and formulations.

4 Claims, 4 Drawing Figures

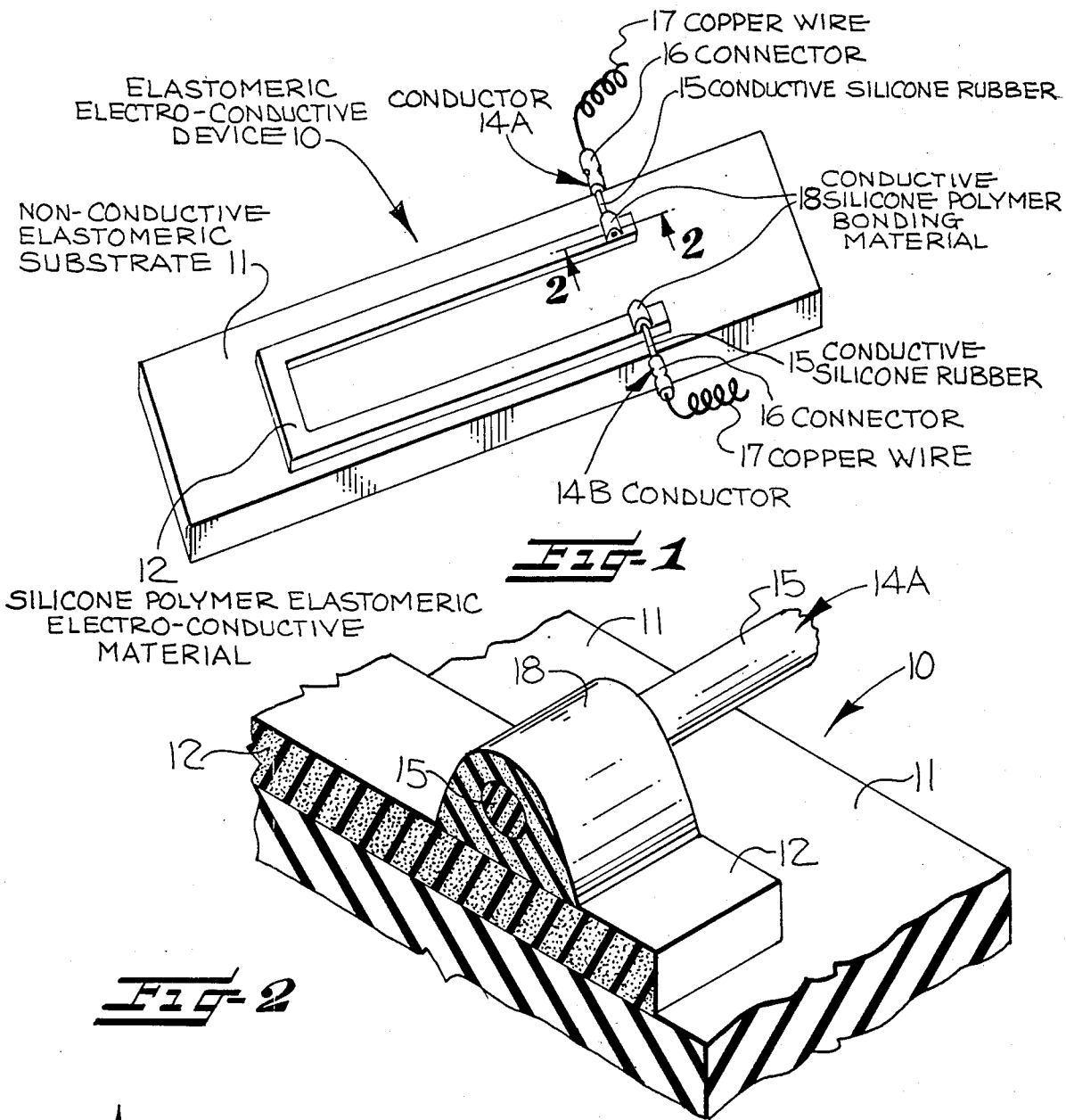

ELASTOMERIC ELECTRO-CONDUCTIVE DEVICES

This invention relates to elastomeric electro-conductive devices.

In our EPC Patent Specification No. 41807 there are disclosed various devices for obtaining a signal which is representative of the mobility of a joint, each of these devices comprising an elastomeric electro-conductive member and conductor means electrically interconnecting the device with a resistance-sensitive electrical network. The operation of these devices is such that movement of the joint gives rise to extension and contraction of the elastomeric electro-conductive member as a result of which the electrical resistance of the member varies and this variation is measured by the resistance-sensitive electrical network.

It has now been discovered that in such elastomeric electro-conductive devices the quality of interconnection between the elastomeric electro-conductive material and the conductor means plays an important role in attainment of consistent results when the device is repeatedly subjected to a standard stretch-release test. In particular it has been discovered that effecting such interconnection by sewing or stitching a copper wire into the elastomeric electro-conductive material eventually gives rise to marked inconsistencies in the test results and thereby limits the useful lifetime of the device.

According to the present invention there is provided an elastomeric electro-conductive device for monitoring movement in animal/human joints comprising an elastomeric electro-conductive member and conductor means connected to said member for enabling interconnection of the device to an electrical network, wherein each said conductor means is in the form of a length of H.T.V. conductive polymer which is adhesively connected to said member by bonding material being a silicone polymer having the same electrical characteristics as said member.

Preferably the bonding material and said member incorporate the same constituents in identical proportions whereby the physical and electrical characteristics of the bonding material and said member are identical.

Preferably the elastomeric electro-conductive member has a composition and characteristics as disclosed in our EPC Patent Specification No. 89843.

By virtue of the present invention it has been found that repeated stretching and releasing of tension applied to the elastomeric electro-conductive device yields consistent values of measured resistance changes even over prolonged periods of time and it is believed that this arises from the intimate nature of the interconnection between the conductor means and the member created by the bonding material.

The H.T.V. conductive polymer lengths which form the conductor means are inherently suited to a crimped or other mechanical connection with copper or other metal wires in order to extend the conductor means to any desired length for coupling to an electrical network. Further, the H.T.V. conductive polymer lengths may conveniently be as made and sold by J-Sil Ltd.

An embodiment of the present invention will now be described by way of example with reference to the accompanying drawings in which:

FIG. 1 illustrates an elastomeric electro-conductive device in accordance with the present invention;

FIG. 2 illustrates a detail of FIG. 1; and

FIGS. 3 and 4 depict characteristics of components of the device.

As is shown in FIG. 1 of the drawings an elastomeric electro-conductive device 10 for monitoring movement in animal/human joints comprises a non-conductive elastomeric substrate 11 on which is mounted a U-shaped member 12 which is electro-conductive, the free ends of the limbs of the U-shape being respectively connected to connector means 14A, 14B. The means 14A, 14B are essentially identical and therefore only one will be further described.

Conductor means 14A comprises a length 15 of H.T.V. conductive polymer which at one end is connected by way of a crimped connector 16 to a length of copper wire 17 (externally insulated), and at its other end length 15 is adhesively bonded to member 12 by a body 18 of bonding material as is more clearly shown in FIG. 2. The body 18 has the same constituents as and in identical proportions to the constituents of the member 12 and by virtue of the body 18 the conductor means 14A is effectively chemically welded to the member 12 across the entire width of the member 12 so that a superior electrical connection is provided therebetween in comparison to that achieved by sewing or stitching copper wire directly to the member 12. Further, because the conductor means 14A is made of a length 15 of H.T.V. conductive polymer a limited degree of resiliency is provided in the length itself in comparison to the relative rigidity evident from copper wire.

By way of example member 12 preferably has a composition of 100 g silicone polymer gum (C2501), 70 g graphite (having a particle size of the order of 50 microns or less) and 20 g Arachis oil vulcanised at room temperature using 2 g of DBTL (di-butyl-tin-dilaurate) as curing agent, 5 g of Silester OS as crosslinking agent. Accordingly member 12 has an ultimate tensile strength of 0.65 M Nm$^{-2}$, an elongation at break of 87%, and a volume resistivity of 0.073 $\Omega$m.

Conveniently, H.T.V. polymer length 15 utilises a methyl vinyl polysiloxane polymer such as EP 494 (made and sold by J-Sil Ltd.) and containing about 30% carbon black to render the polymer conductive, the polymer being vulcanised at high temperature utilising di-cumyl-peroxide as curing agent.

Conveniently also the body 18 of bonding material has a composition of 100 g silicone polymer gum (C2501), 70 g graphite (having a particle size of the order of 50 microns or less) and 20 g Arachis oil vulcanised at room temperature using 2 g of DBTL as curing agent and 5 g of Silester OS as crosslinking agent.

The characteristics of the material forming body 18 and member 12 as specified by way of example are illustrated in FIG. 3 in the form of a Mooney Plot which is a well known technique for representing the physical characteristics of an elastomeric material. The ordinate axis (Y-axis) denotes the function $\phi$ where
t,0050
whilst the abscissa (X-axis) denotes the function $$\lambda^{-1} = l_o/l$$

where $\lambda$ = elongation and $l$ and $l_o$ are the lengths of the tested sample in the deformed and undeformed states respectively.

The characteristics of the HTV polymer forming length 15 are comparably illustrated in FIG. 4 by way of a Mooney Plot and it will be evident that in terms of elongation (λ) both FIG. 3 and FIG. 4 have regions where φ, which is representative of resistance to extension, is substantially constant (but at respective values) and it is preferred that the device 10 is constrained to operational extensions within this range.

In order to manufacture the device 10 the non-conductive elastomeric substrate 11 is initially manufactured, preferably using silicone polymer gum (C2501), DBTL and Silester OS in a manner recommended by the manufacturers of the polymer gum, the mixed materials being cast to form a slab of suitable width, length and thickness as required for the substrate 11. Member 12 and body 18 are independently manufactured, for example utilising the method detailed in the aforesaid EPC Patent Specification No. 89843. It is to be noted however that less stringent manufacturing tolerances can be imposed if the manufacturing method is modified by introducing to the unvulcanised mixture of constituents a volume of a volatile additive (such as Toluene) in which the oil and gum dissolve and/or disperse miscibly since the additive renders the mixture less viscous and therefore more controllable for casting purposes. By way of example the body 18 and the member 12 may each be manufactured from a mixture of 100 g silicone polymer gum (C2501), 70 g graphite carbon particles, 20 g Arachis oil, 5 g Silester OS crosslinker, 2 g DBTL curing agent, and 100 ml Toluene. The member 12 is cast to shape in a mould and after vulcanising at room temperature is released from the mould and is adhesively bonded to the substrate 11 using as an adhesive agent a volume of an identical mixture as that from which member 12 was cast, the adhesive agent being uniformly and sparingly applied to member 12 prior to member 12 being positioned as required on substrate 11. In this connection it will be appreciated that the adhesive agent is utilised as such during its vulcanisation process and when vulcanisation is complete member 12 is chemically welded to substrate 11. In order to bond the HTV polymer lengths 15 to the member 12 a further identical mixture to that from which the member 12 was cast is prepared and applied to one end of each length 15, conveniently by submerging the end into a bath of the mixture and the coated end of length 15 is then located on member 12 with slight pressure and held motionless until the mixture vulcanises to chemically weld length 15 to the member 12.

It will be appreciated that the body 18, in accordance with the present invention, is provided with the same electrical characteristics as the member 12 so that there is no electrical discontinuity between body 18 and member 12 and because the bonding material is a silicone polymer, therefore being vulcanised at room temperature, the process of adhesion between body 18 and member 12 is effected without varying the electrical characteristics of member 12 during fabrication of the device 10.

What is claimed is:
1. An elastomeric electro-conductive device comprising a silicone polymer elastomeric electro-conductive member and conductor means connected to said member for enabling interconnection of the device to an electrical network, wherein said conductor means comprises a length of high temperature vulcanised conductive rubber which is adhesively connected to said member by a body of bonding material being a silicone polymer having the same electrical characteristics as said member.

2. A device as claimed in claim 1, wherein the body of bonding material and the member incorporate the same constituents in identical proportions whereby the physical and electrical characteristics of the body and the member are identical.

3. A device as claimed in claim 2, wherein the body and the member each have a formulation of:
   100 g silicone polymer gum
   70 g graphite carbon particles
   20 g Arachis oil
   5 g Silester O.S. cross-linker
   2 g DBTL curing agent.

4. A device as claimed in claim 1, wherein the length of HTV conductive rubber comprises a methyl vinyl polysiloxane polymer and curing agent loaded with carbon black.